United States Patent [19]
Wort et al.

[11] Patent Number: 5,916,456
[45] Date of Patent: Jun. 29, 1999

[54] DIAMOND TREATMENT FOR PASSIVATING STRESS SURFACE DEFECTS

[75] Inventors: Christopher John Howard Wort, Oxon; Charles Gerard Sweeney, Middlesex; Andrew John Whitehead, Camberley, all of United Kingdom

[73] Assignee: Diamanx Products Limited, Wantage Oxon 12, United Kingdom

[21] Appl. No.: 08/709,768

[22] Filed: Sep. 9, 1996

[30] Foreign Application Priority Data

Jun. 29, 1995 [GB] United Kingdom .................... 9513426

[51] Int. Cl.$^6$ ...................................... C23F 1/00
[52] U.S. Cl. .......................... 216/109; 216/108; 216/100; 216/52; 427/585; 427/294; 117/929; 423/446; 204/192.15
[58] Field of Search .................... 216/109, 108, 216/100, 52; 427/585, 586, 587, 589, 294; 204/192.1, 192.15; 117/929

[56] References Cited

U.S. PATENT DOCUMENTS

| | | | |
|---|---|---|---|
| 5,270,077 | 12/1993 | Knemeyer et al. | 427/249 |
| 5,336,368 | 8/1994 | Iacovangelo et al. | |
| 5,451,430 | 9/1995 | Anthony et al. | 427/372.2 |
| 5,672,395 | 9/1997 | Anthony et al. | 427/444 |

FOREIGN PATENT DOCUMENTS

| | | |
|---|---|---|
| 0 400 947 | 12/1990 | European Pat. Off. |
| 0 590 871 | 4/1994 | European Pat. Off. |
| 2 228 745 | 9/1990 | United Kingdom |

Primary Examiner—Marion McCamish
Assistant Examiner—Cheryl Juska
Attorney, Agent, or Firm—Scully, Scott Murphy & Presser

[57] ABSTRACT

A surface of a diamond, particularly a diamond window, is treated by depositing a layer of a carbide-forming metal such as titanium, on the surface and thereafter removing the layer. The treatment has the effect of passivating stress surface defects in the diamond such as grain boundaries, twin defects and polishing damage.

9 Claims, 14 Drawing Sheets

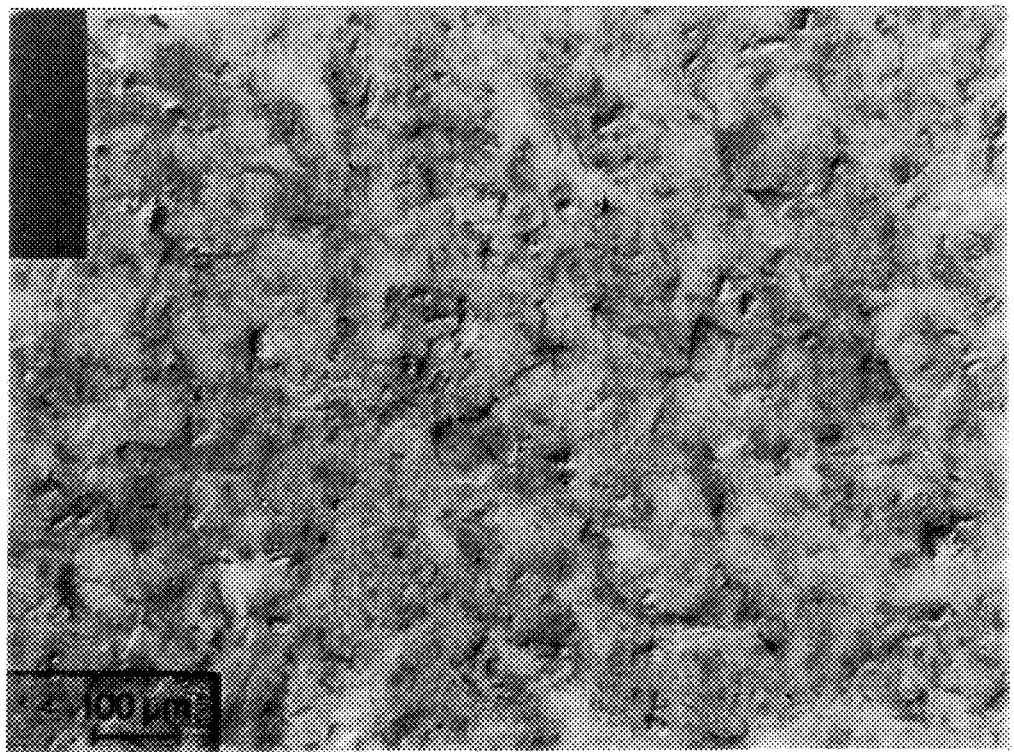
FIG. IA
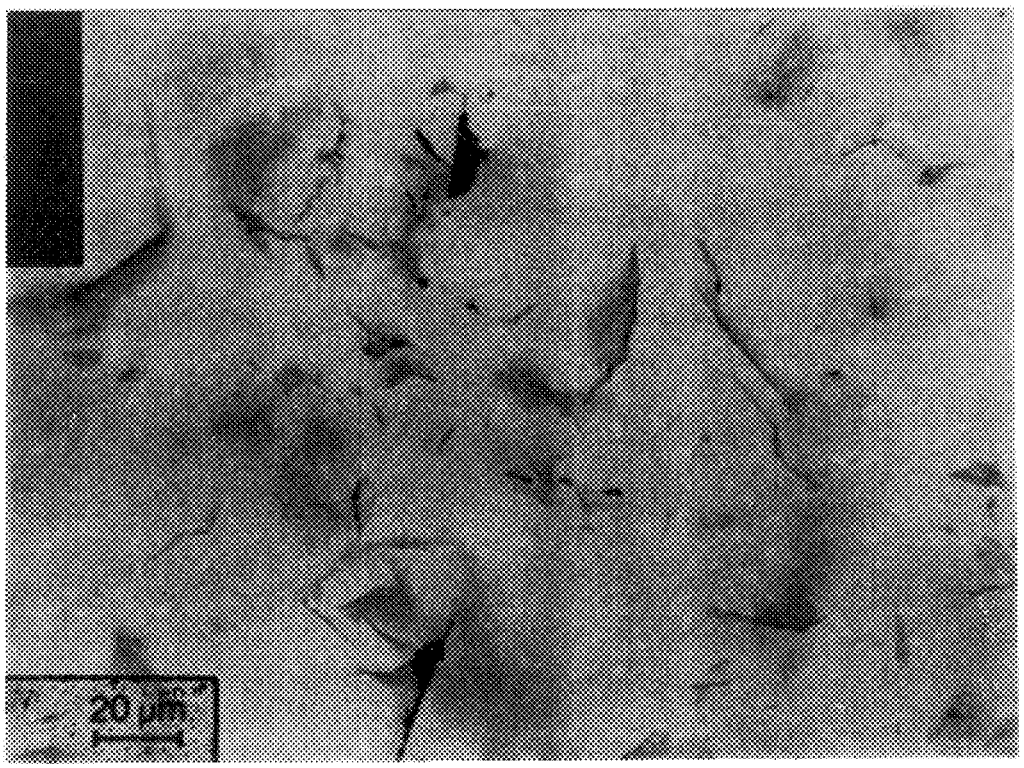
FIG. IB

DIAMOND TREATMENT FOR PASSIVATING STRESS SURFACE DEFECTS

BACKGROUND OF THE INVENTION

This invention relates to diamond treatment.

DESCRIPTION OF THE PRIOR ART

Diamond is an extremely hard and wear-resistant material which may be used in a wide range of applications. One of these applications is as an outside window for missiles and similar devices. In such applications it is important that the window is effective and efficient in transmitting IR and similar radiation. It has been found that grain boundaries, twin defects and polishing damage act as areas in which the diamond may degrade when exposed to air at elevated temperature. Any such damage reduces the efficiency and effectiveness of the diamond to transmit IR and other electromagnetic radiation. The etched defects scatter and absorb the radiation.

SUMMARY OF THE INVENTION

According to the present invention, a method of treating a diamond surface includes the steps of depositing a layer of a carbide-forming metal on the surface and thereafter removing the layer. It has been found that treatment of the diamond surface in this manner has the effect of passivating stressed surface defects in the diamond such as grain boundaries, twin defects and polishing damage.

DETAILED DESCRIPTION OF THE INVENTION

Figure 2A:
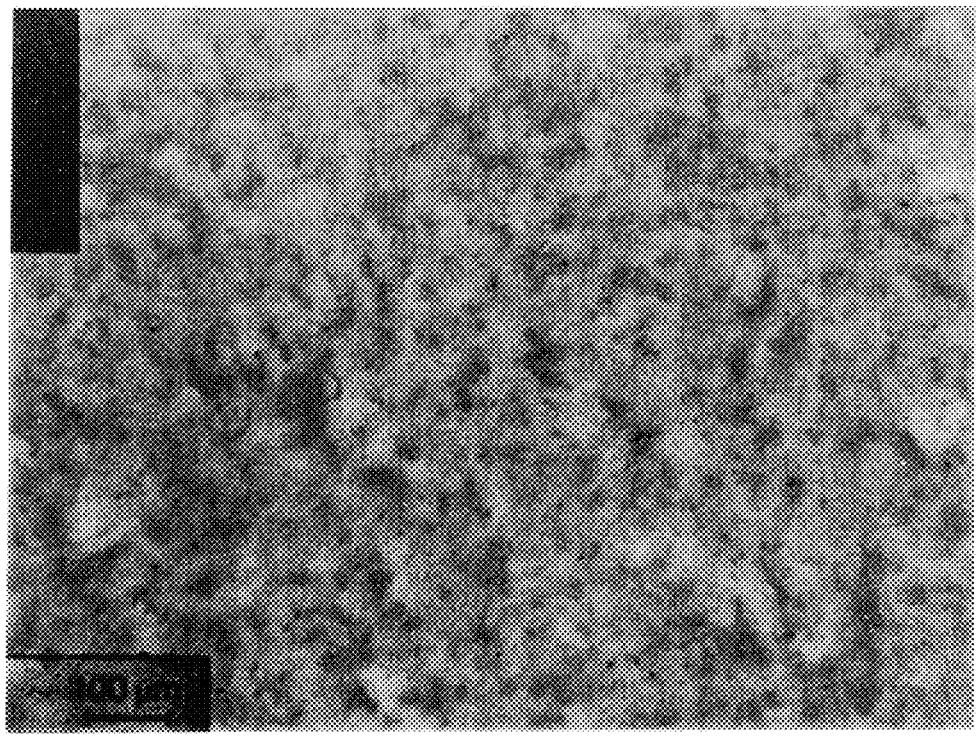

The diamond may be natural or synthetic diamond, but will generally be chemical vapour deposition (CVD) diamond. CVD diamond is diamond made by any one of a number of chemical vapour deposition methods known in the art. These methods generally involve providing a mixture of hydrogen or oxygen gas and a suitable gaseous carbon compound such as a hydrocarbon, applying sufficient energy to that gas to dissociate the hydrogen or oxygen into atomic hydrogen or oxygen, and the gas into active carbon ions, atoms or CH type radicals, and allowing such species to deposit on a substrate to form diamond. Dissociation of the gases can take place by use of a hot filament, microwave or RF energy or DC discharges.

In one form of the invention, the diamond surface which is treated is one which has been polished. It has been found that polishing tends to introduce surface defects into the diamond. These may be passivated by the method of the invention.

The carbide-forming metal may be in the form of a metal itself or as part of an alloy. Examples of suitable carbide-forming metals are titanium, molybdenum, tungsten, tantalum, niobium, hafnium, scandium, vanadium, chromium, zirconium, lanthanum, rhenium and silicon.

The carbide-forming metal may be deposited on the diamond surface by any method known in the art such as vacuum sputtering, vacuum deposition, chemical vapour deposition or the like. The conditions which are utilised in such deposition methods inevitably causes the carbide-forming metal to form some carbide with the diamond surface on which it is deposited. The carbide formation can be promoted by heat treating the deposited metal layer, typically at a temperature in the range 200° C. to 1300° C. in an atmosphere which inhibits degradation of the diamond. Such atmospheres are, for example, a vacuum or an inert or non-oxidising atmosphere.

It is believed that a passive carbide layer is created at the stressed surface defects in the diamond passivating those defects and significantly lowering their reactivity to oxygen at elevated temperature, i.e. temperatures of up to 900° C.

Further, the carbide which is present at the surface defects is capable of absorbing radar frequencies. This is of importance for many IR windows and domes which require some degree of electromagnetic shielding to prevent the radar from "scrambling" seeker electronics. This is particularly so when the carbide-forming metal is one which forms electrically conducting carbides such as titanium carbide. This leads to round grain boundaries which are conductive and absorb radar frequency making diamond having a surface thus treated useful as a screen to radar. The carbide remaining at the surface defects, after removal of the layer, can be designed to exclude selected radiation wavelengths and thereby act as a filter.

It is also possible to convert the carbide which remains at the surface defects, after removal of the layer, to another form, for example, an oxide or a nitride, to increase transmission of radiation such as IR radiation.

Removal of the deposited carbide-forming metal layer will typically be achieved by acid dissolution. In general, a strong inorganic acid such as a mixture of hydrofluoric and nitric acids will be used, although mechanical means such as rubbing can also be used.

Treatment of the diamond surface according to the method of the invention, has the effect of enhancing the high temperature oxidation resistance of the diamond surface. This improves the efficiency and effectiveness of the diamond to transmit IR and similar radiation. Thus, the method of the invention has particular application to treating at least one of the surfaces of a diamond window or dome, particularly a CVD diamond window or dome.

The invention will now be illustrated by the following examples.

EXAMPLE 1

A double polished CVD diamond film was cleaned and placed in a sputtering chamber. A shadow mask covered half the exposed face. The system was evacuated to 0.02 mtorr (2.66 Pa) (before increasing the pressure with pure argon) and the target pre-sputtered in pure argon for five minutes. A surface of the sample was then pre-etched using RF (with a −800V DC bias) for two minutes to remove any surface contamination. After two minutes the target power was increased and the substrate bias voltage decreased to 60V to give a net deposition of titanium on to the unmasked area of the CVD diamond film. Deposition proceeded for ten minutes.

The sample was then turned over and the opposite side masked before following the deposition procedure described above.

Both titanium layers had formed some carbide with the diamond.

The treated film was placed in a body of a strong inorganic acid such as a mixture of hydrofluoric and nitric acid to remove the titanium layers.

The thus treated film was then air-etched at about 900° C. for 1 minute and the IR transmission measured. It was found that the areas of the diamond film which had had a titanium layer applied thereto, had remained unchanged or increased in their IR transmission capabilities whilst the untreated areas had decreased in their IR transmission capabilities, due to scattering and absorption at etched defects.

EXAMPLE 2

In this example, an untreated CVD diamond sample is compared with a CVD diamond sample treated by the method of the invention.

(A) Untreated Sample

A CVD diamond sample, 300 μm thick, was double polished to a fine, optically transparent finish using conventional processing techniques. The sample was thoroughly cleaned and its surfaces photographed using the Nomarski technique.

A small Carbolite furnace was used to heat the sample in an air environment at normal atmospheric pressure. The untreated sample was first heated to 700° C. for 1 minute, then removed and its surfaces photographed before measuring the IR transmission. This procedure was repeated after further heating for 1 minute at 800° C., 900° C. and 1000° C.

Effect on Surface Finish

Figure 2B:
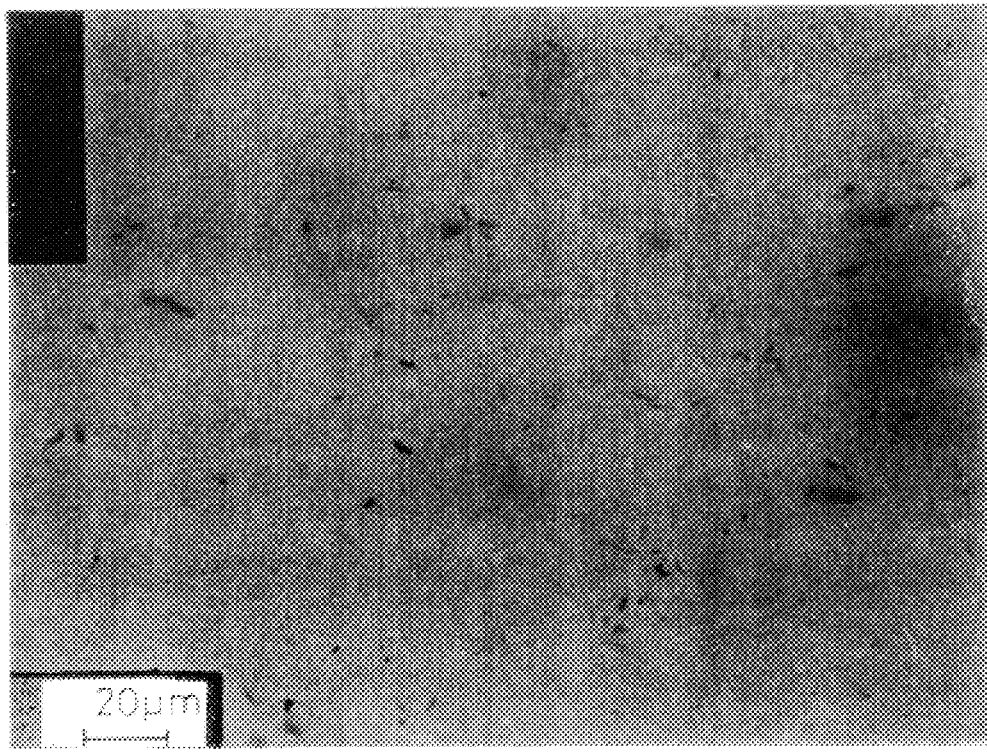

The growth surface of the polished sample, prior to air etching, is shown in FIG. 1A. The surface relief is enhanced through the phase contrast facility and looks normal for high quality CVD diamond. FIG. 1B is a higher magnification photograph and shows crystallographic defects and grain boundaries. The polished substrate surface, prior to air etching, is shown in FIGS. 2A and 2B. The surface is smooth and featureless with no visible grain boundaries and very few pits.

Figure 3:
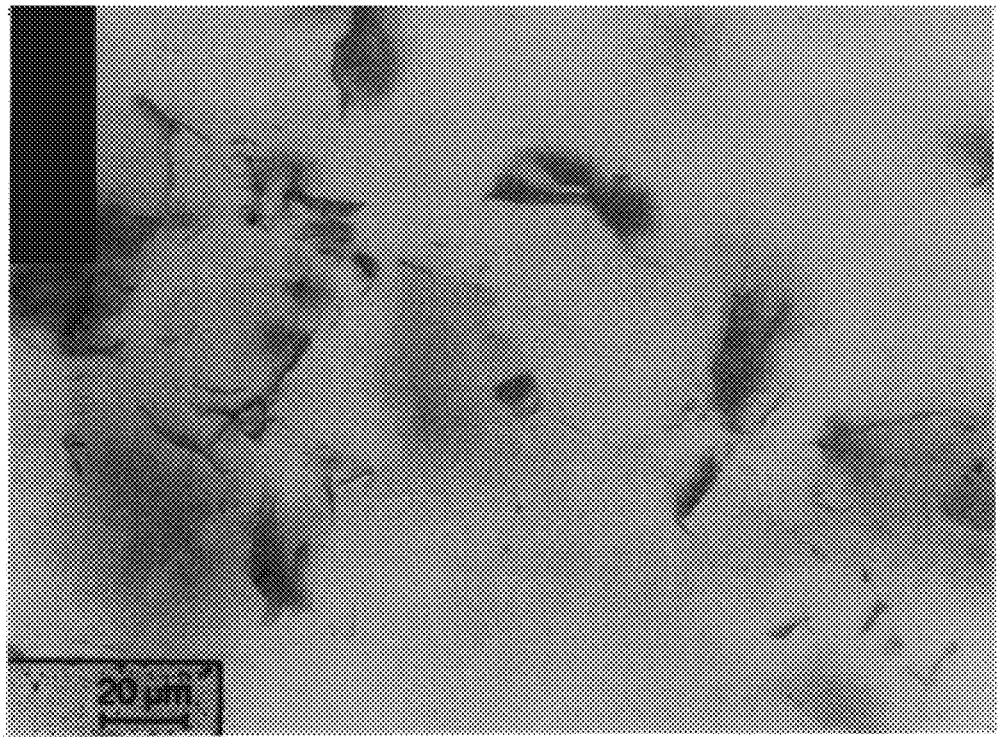
Figure 4:
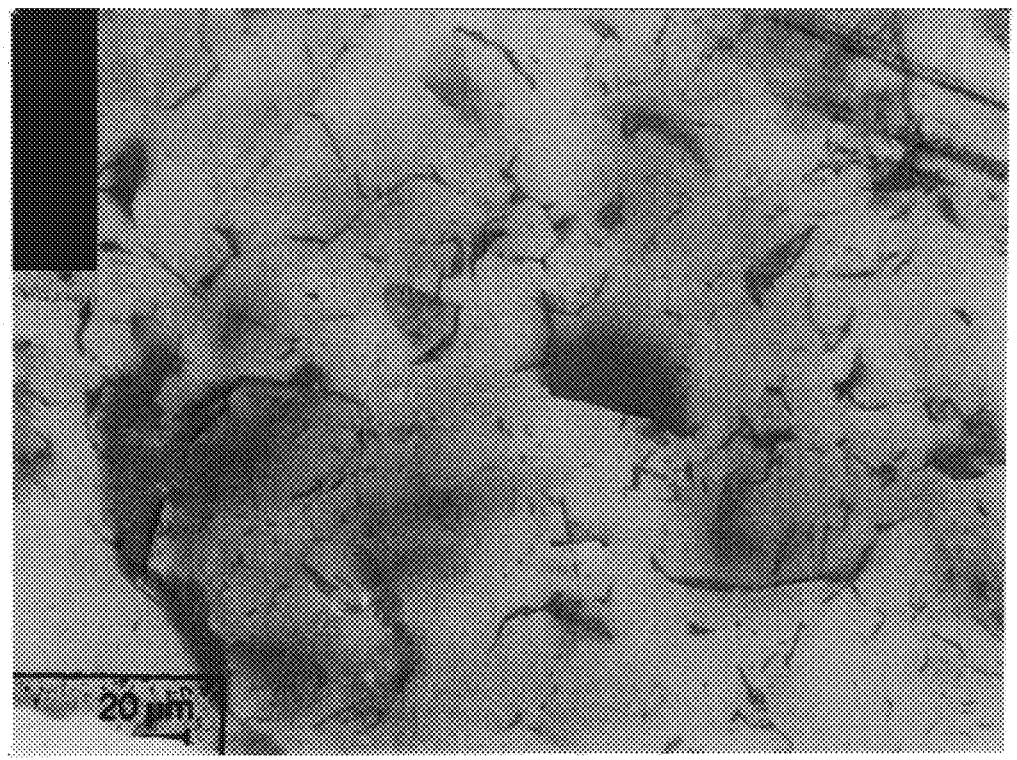

FIG. 3 shows the growth surface after it had been air etched at 700° C. for 1 minute. There is no evidence of any degradation to the surface finish. However, the surface is degraded after a further air etch at 800° C. for 1 minute, as shown in FIG. 4. Surface defects have been etched and become visible and, in particular, the grain boundaries have begun to open up.

Figure 5:
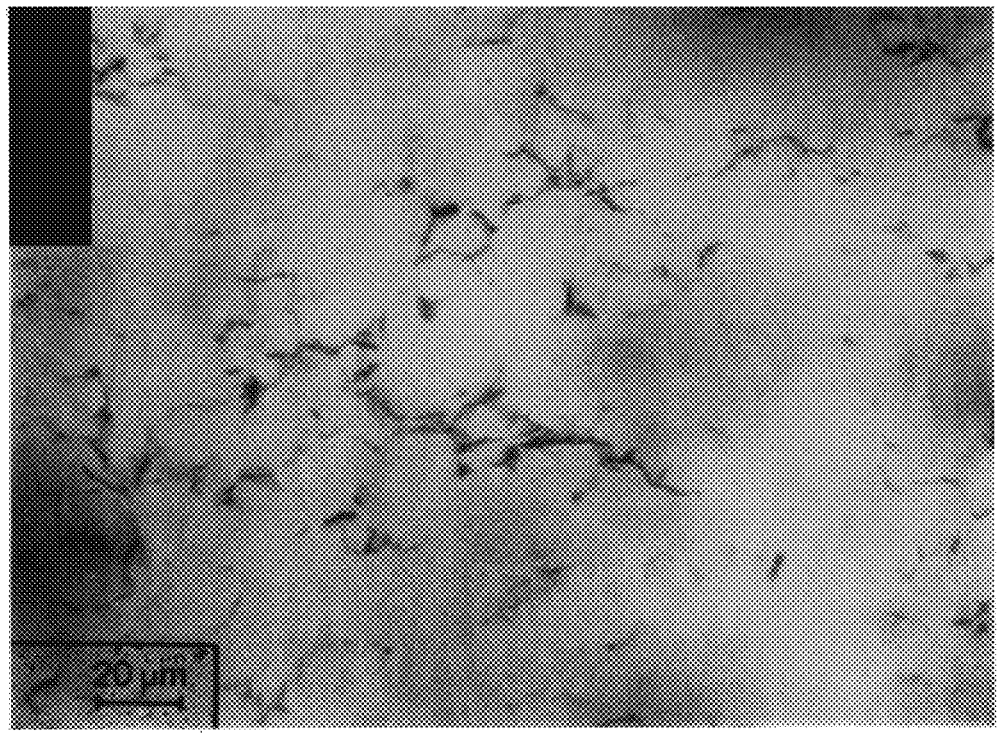
Figure 6:
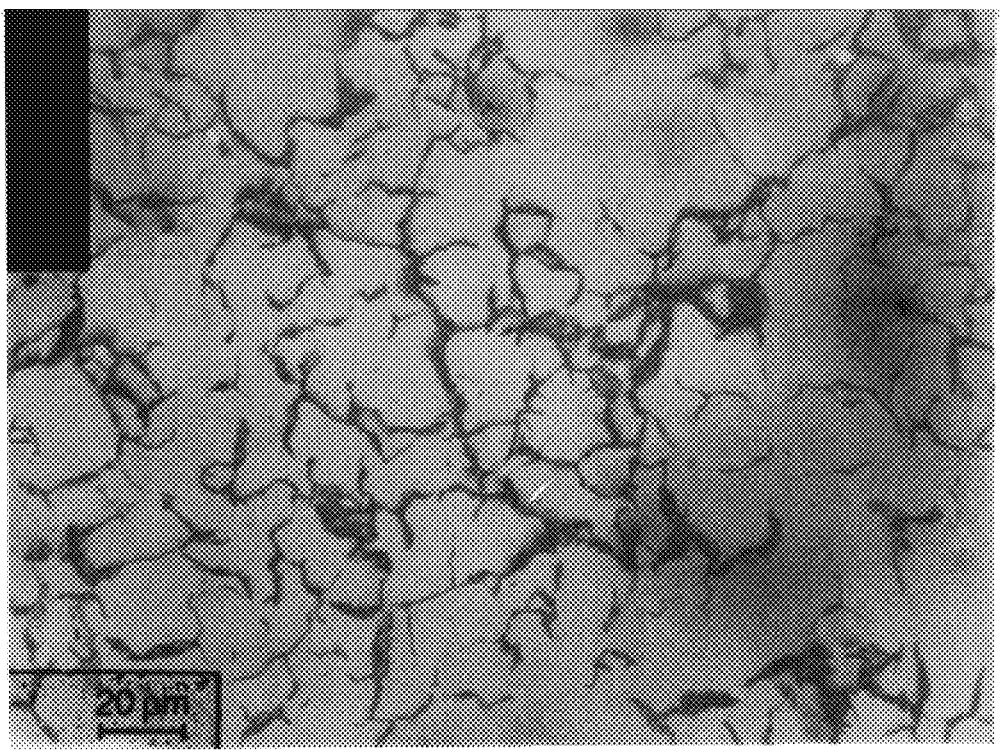

Although the growth surface remains untouched, a 700° C. air etch for 1 minute reveals many of the grain boundaries in the substrate surface, as shown in FIG. 5. Further air etching at 800° C. for 1 minute results in a severely degraded surface polish, shown in FIG. 6.

Figure 7A:
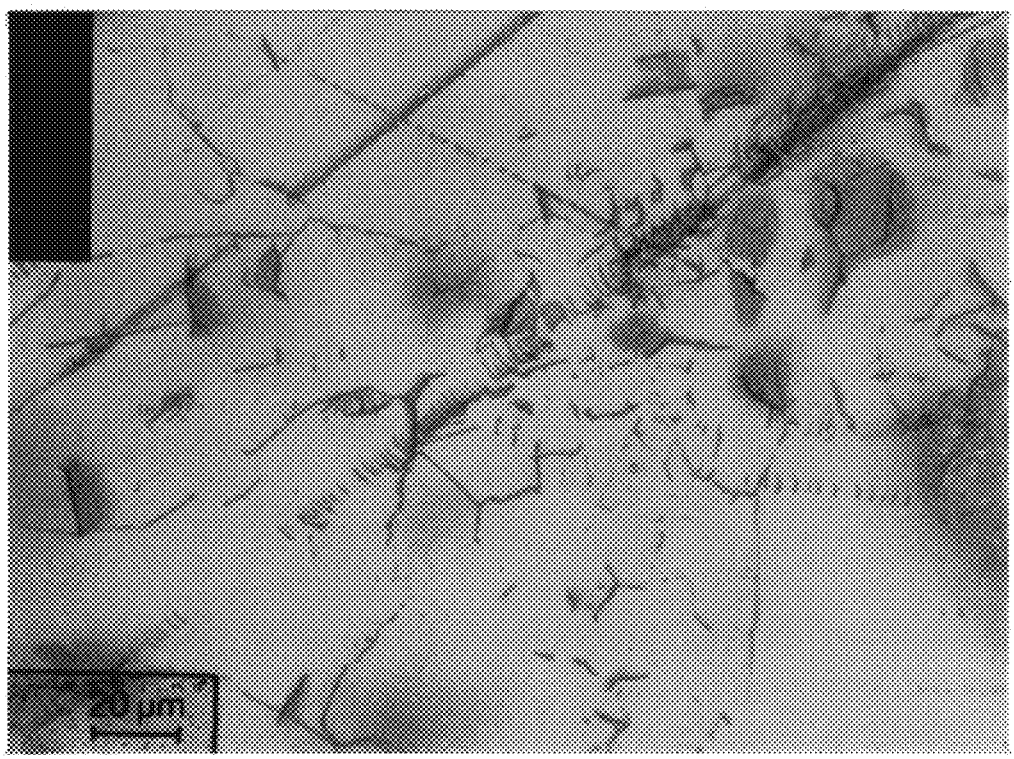
Figure 7B:
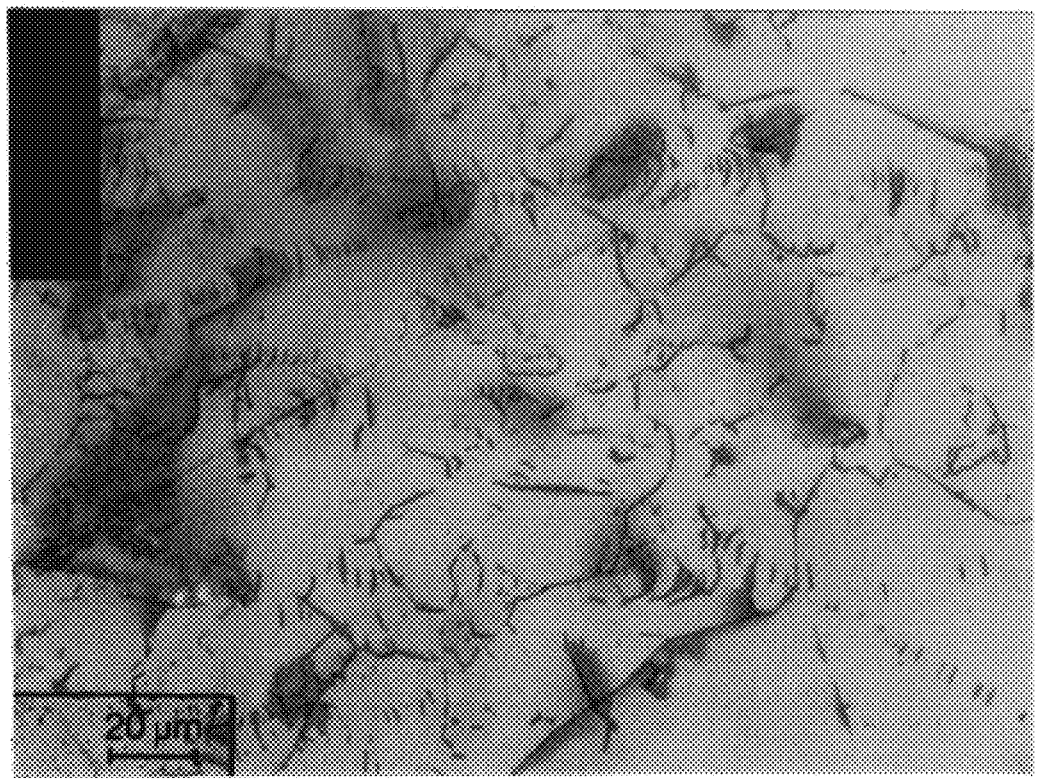

When the sample is returned to the furnace for a 1 minute etch at 900° C., there is clear evidence of sub-surface damage appearing in the growth surface. The diagonal lines shown in FIGS. 7A–B, which are photographs of different sections of a growth surface both at the same magnification, are almost certainly sub-surface damage caused by a previous lapping process.

Figure 8:
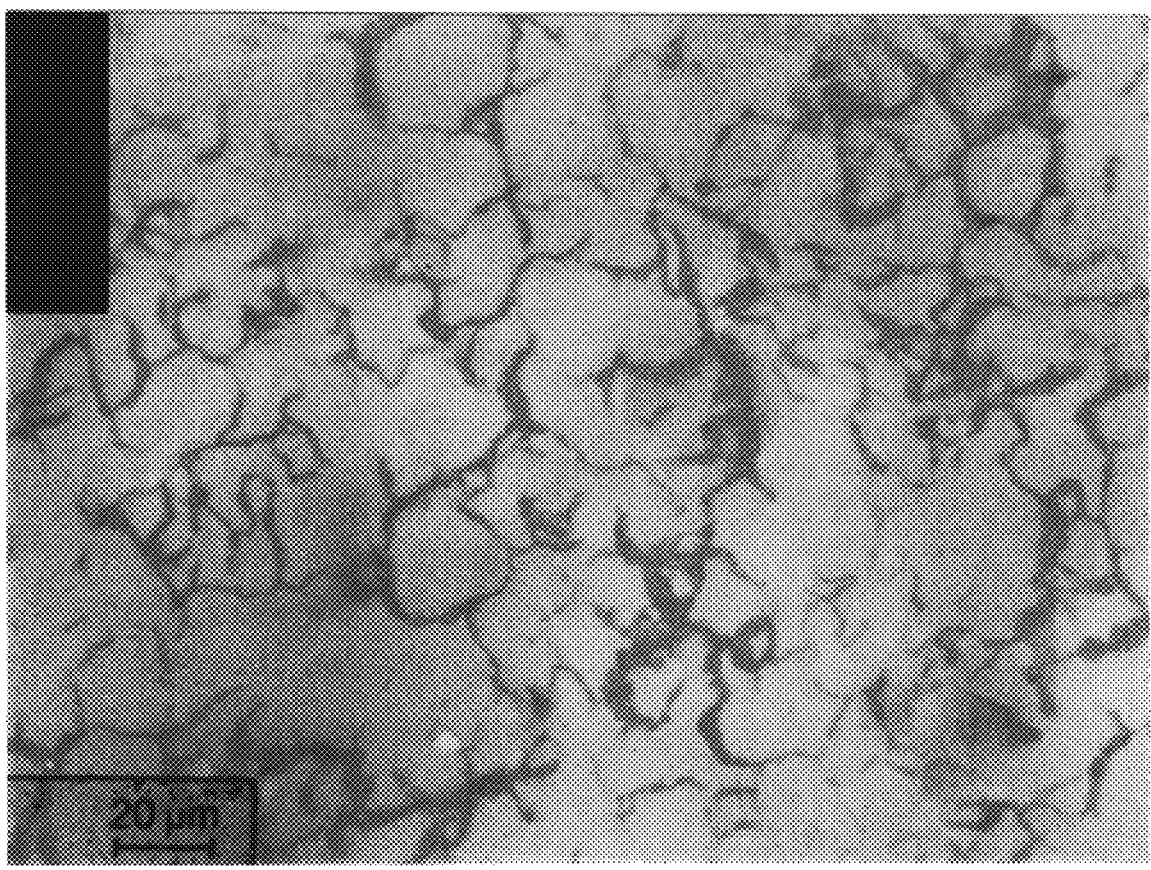

The air etch reveals this by enhancing the size of the defect. It appears as if a large lapping particle has been "dragged" across the surface, inducing concoidal fractures beneath the surface. This subsurface damage, invisible on the as polished surface, could severely weaken the material strength and lower its resistance to rain erosion. FIG. 7 clearly shows that the untreated CVD diamond surface is severely attacked by air at 900° C. The substrate surface, after the 900° C. air etch, is shown in FIG. 8. The grain boundaries have opened up even further and there is evidence of etching at twins and other crystallographic defects.

Figure 9A:
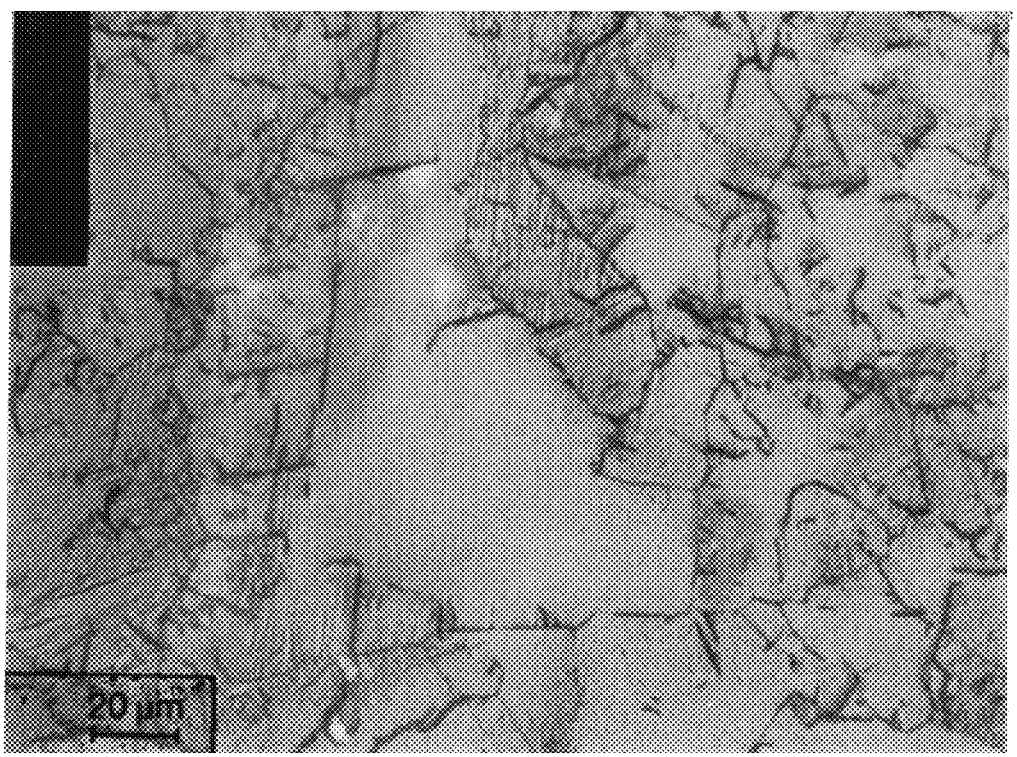
Figure 9B:
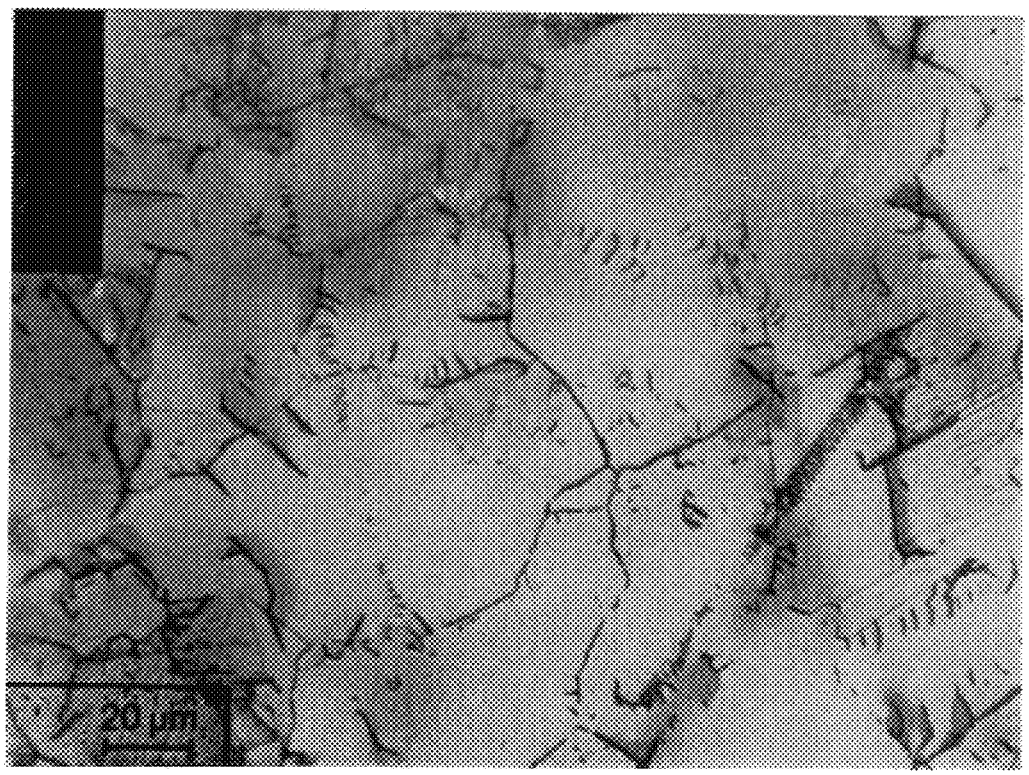

A 1000° C. air etch for 1 minute has a catastrophic effect on the surface finish, as shown in FIG. 9. The growth surface is now covered with etched grain boundaries and etched crystal defects. Interestingly, there are some crystallites which have no etched defects as shown in FIG. 9A, whereas FIG. 9B shows crystallites that have subsurface polishing damage.

Figure 10A:
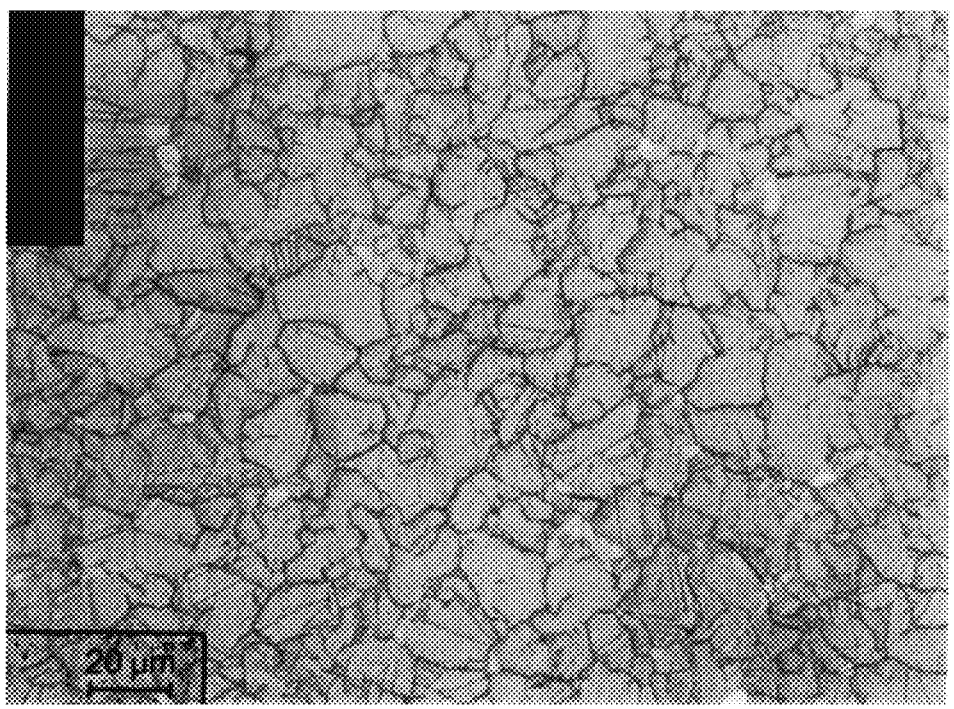
Figure 10B:
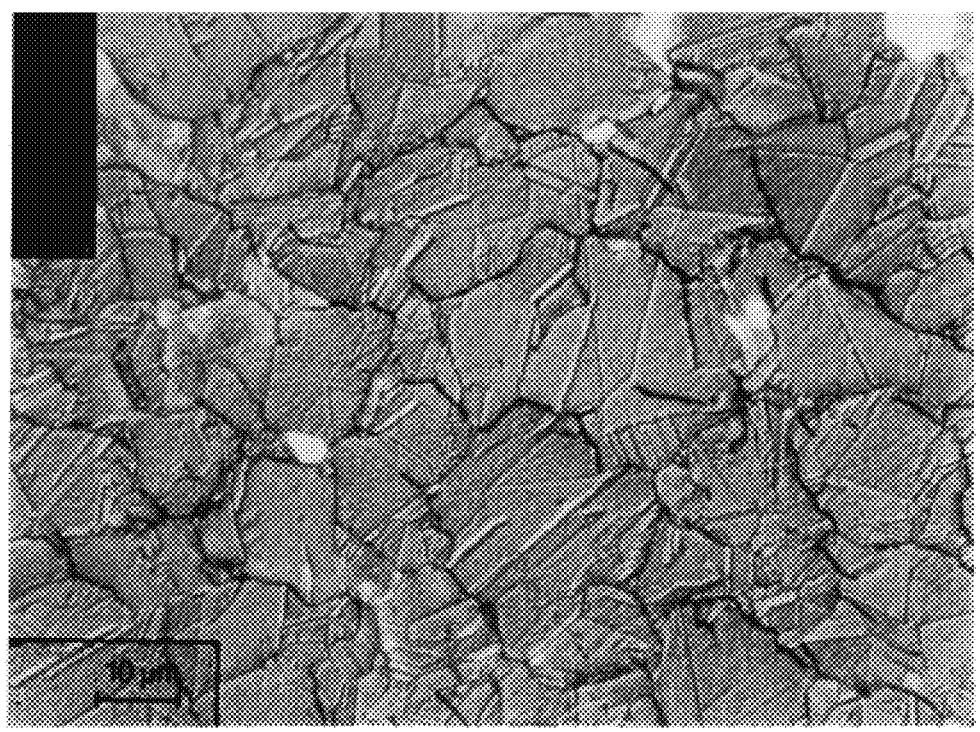

FIGS. 10A and 10B show the highly defective nature of the CVD diamond substrate surface which exhibits multiple twins and other macroscopic crystal defects, in addition to the grain boundaries. All the areas of high stress concentration, such as twin planes and grain boundaries, have been preferentially etched by the hot air.

The air etch reveals imperfections in the CVD diamond plates, both crystallographic and processing induced. The substrate surface is attacked at 700° C. although the growth surface is not. This is probably due to the more defective nature of the substrate surface and the fact that it has a higher intrinsic stress level than the growth surface.

Effect on IR Transmission Properties

A Perkin-Elmer FTIR was used to make the IR measurements. Due to the small size of the sample, the measurements were made through a 2 mm aperture.

Figure 11:
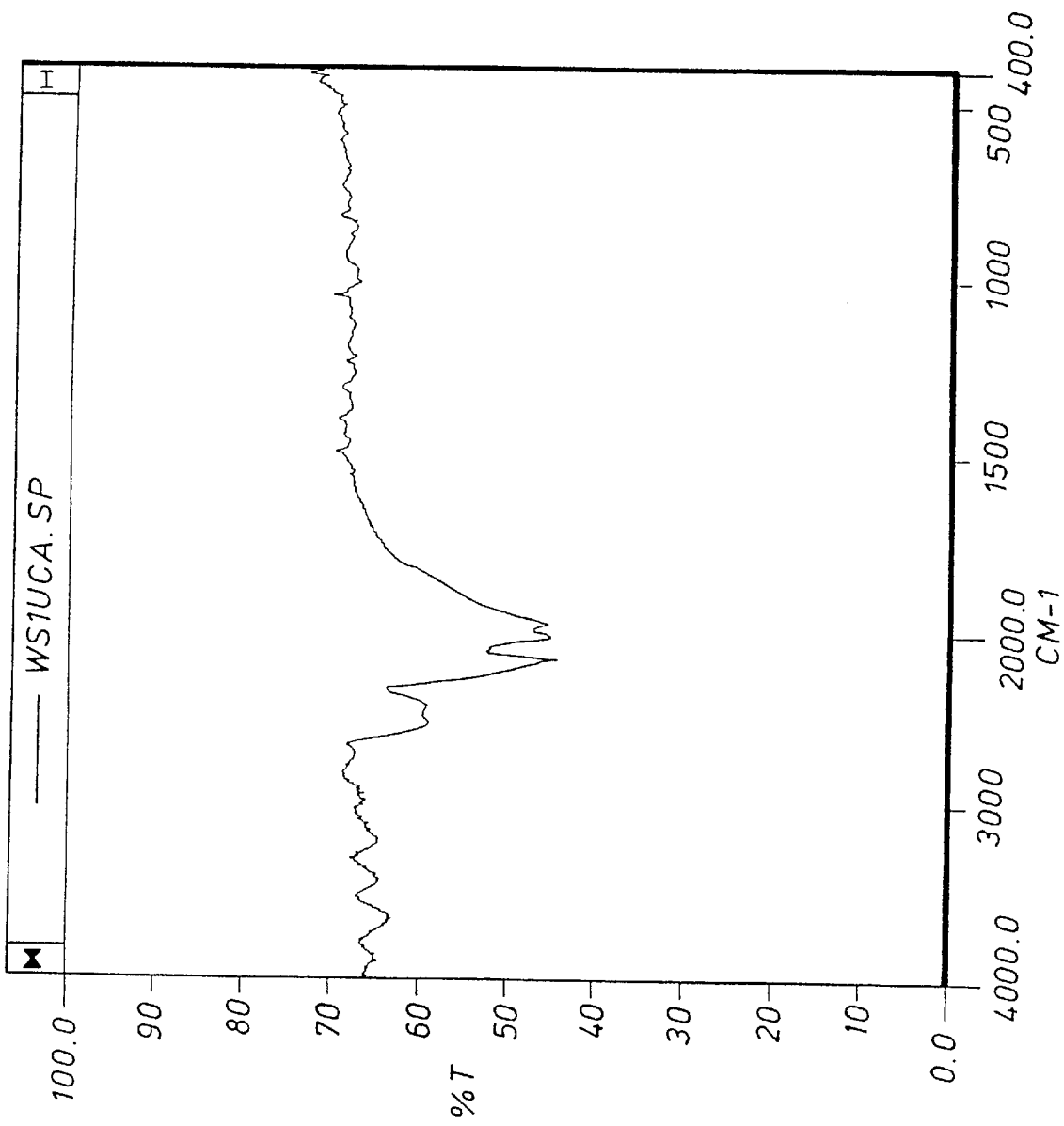
Figure 12:
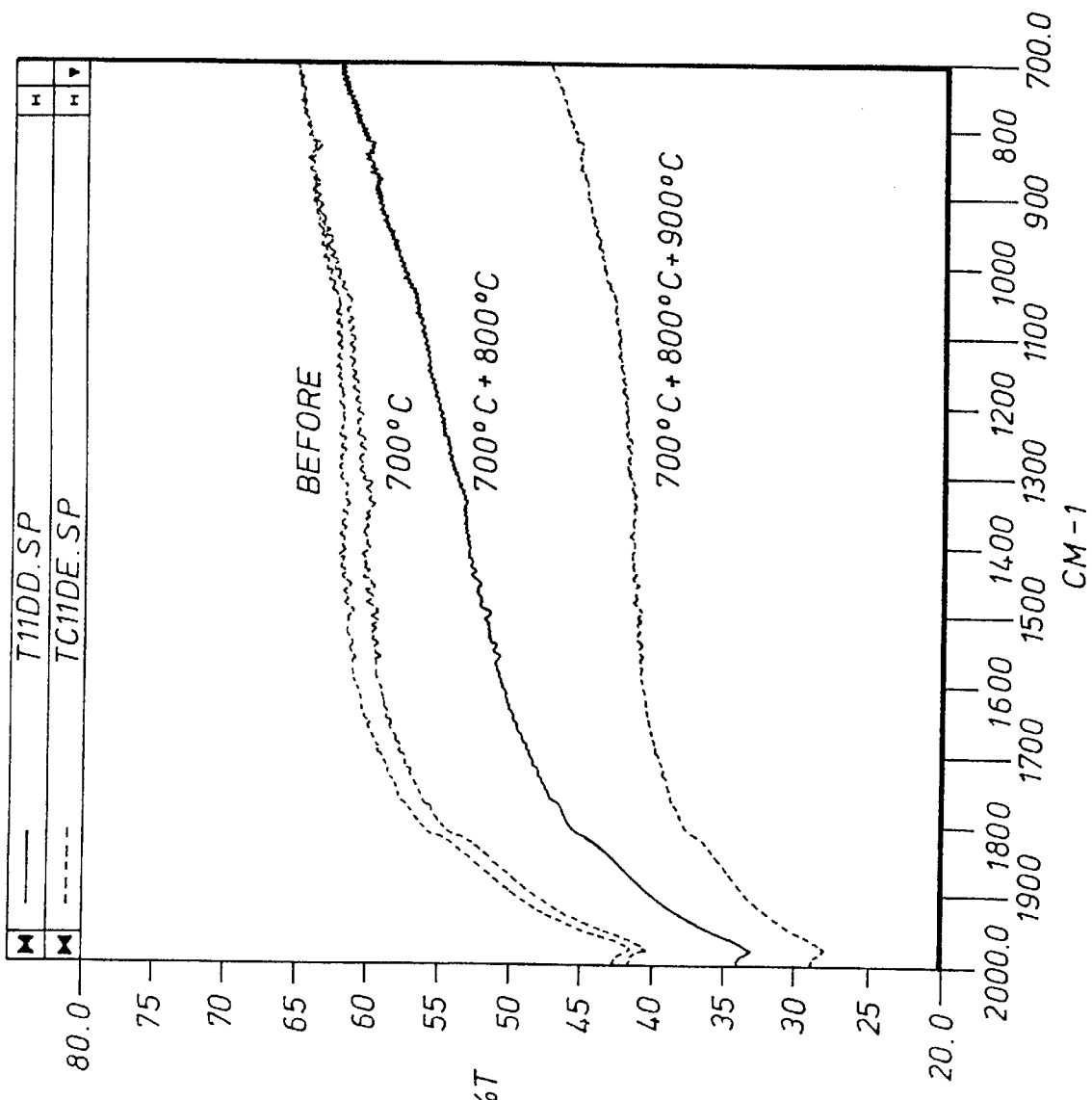

The IR transmission through the sample before the etching experiments is shown as FIG. 11 and FIG. 12 is the transmission after the air etching.

The hot air attacks the grain boundaries which open up and cause scattering, the scattering then lowers the IR transmission and would distort any image viewed through the sample. In the visible, the samples appear to become frosted with the scattering occurring from both surfaces. There does not appear to be any damage to the bulk of the material.

The following table gives a summary of the transmission retained after the air etching experiments.

| Wavelength (μm) | Not etched | 1 min. etch at 700° C. | Additional 1 min. etch at 800° C. | Additional 1 min. etch at 900° C. |
|---|---|---|---|---|
| 8 | 62% | 61% | 55% | 42% |
| 10 | 63% | 62,5% | 57,5% | 44% |
| 14 | 65,5% | 65,5% | 62% | 47,5% |

These results show the catastrophic effect the hot air etch has on the IR properties of the CVD diamond layer. It is, therefore, necessary to provide some form of protection to the CVD diamond optical elements if they are to be used in high speed flight applications, even if the flight time is short.

The protection could be in the form of an oxidation resistant coating, however, such coatings would degrade the transmission of the window and almost certainly erode away whilst flying through rain.

(B) Surface Modified CVD Diamond—Thermal Stability

Hot air, as shown above, preferentially attacks the grain boundaries and defects, whilst leaving the more perfect crystallites alone. An objective, achieved by the method of the invention, is to modify these defects to render them inert to chemical attack by the hot air, without significantly reducing the overall IR transmission properties of the window.

Surface Modification Procedure

A double polished CVD diamond sample was cleaned and placed in the sputtering chamber. A shadow mask covered half the exposed face. The system was evacuated to 0.02 mtorr (2.66 Pa) and the target pre-sputtered in pure Ar for 5 minutes. The sample surface was then pre-etched using RF (with a −800V DC bias) for two minutes to remove any surface contamination. After two minutes the target power was increased and the substrate bias voltage decreased (to 60V) to give a net deposition of Ti onto the unmasked area of the CVD diamond sample. Deposition proceeded for 10 minutes.

The sample was then turned over and the opposite side masked before following the deposition procedure described above. After coating, the sample was removed and titanium layers lightly coated with gold.

The titanium formed some titanium carbide on both surfaces on which it was deposited.

The sample surfaces were then photographed before removing the Ti/Au layers by dissolution in a hydrofluoric/nitric acid mixture.

Effect on the Modified Surface Finish

Figure 13A:
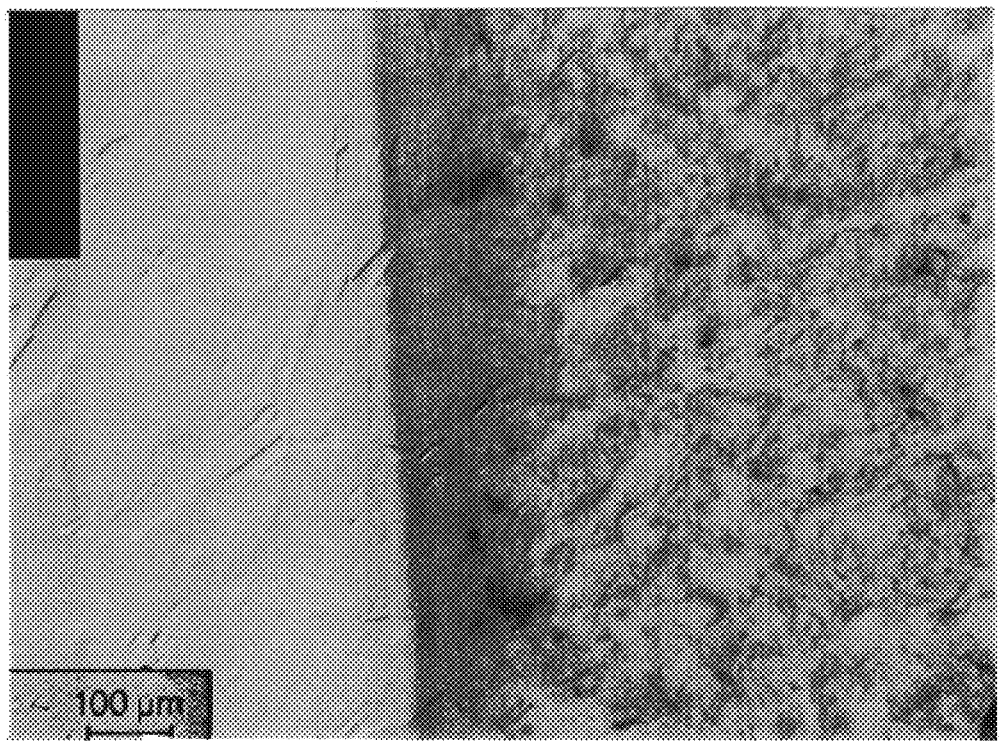
Figure 13B:
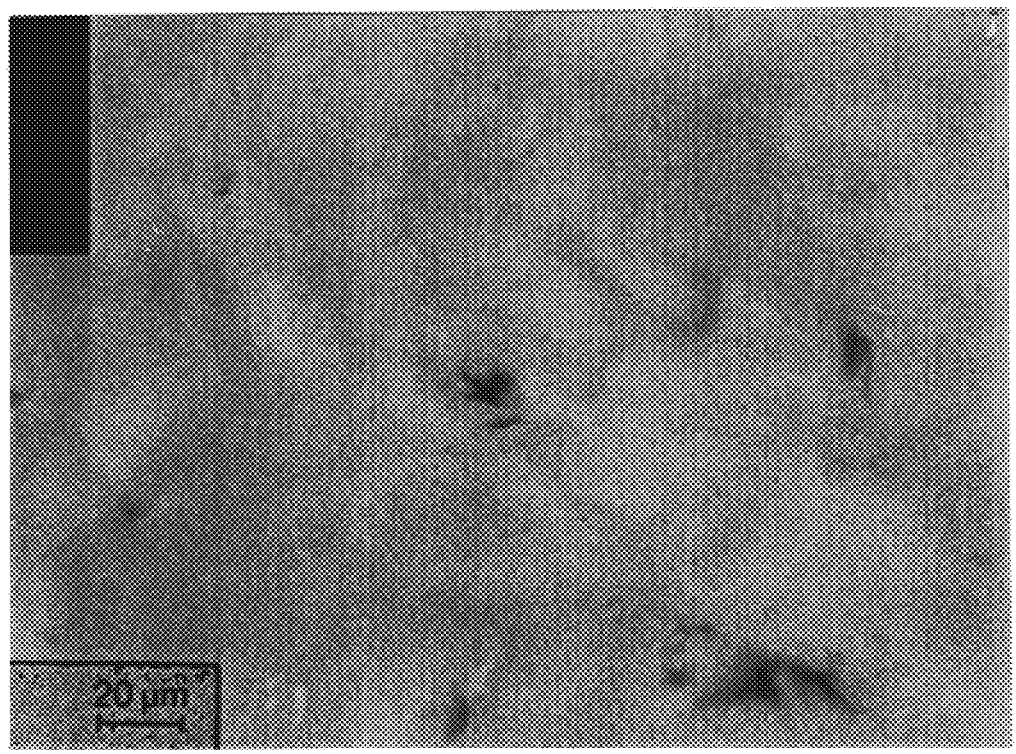

FIG. 13A shows the growth surface of the polished and coated CVD diamond sample. The area on the left hand side of the photograph is the Ti/Au layer. Surface features can clearly be seen on the coated area, whereas the uncoated region is relatively featureless. FIG. 13B is a higher magnification photograph of the uncoated region.

Figure 14A:
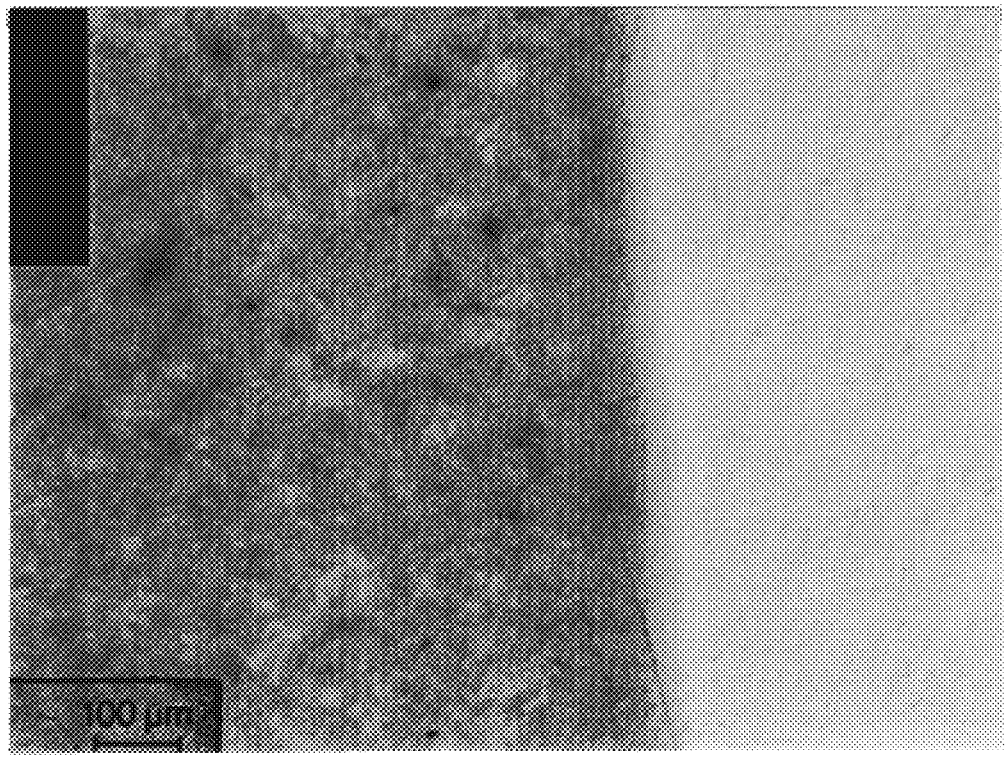
Figure 14B:
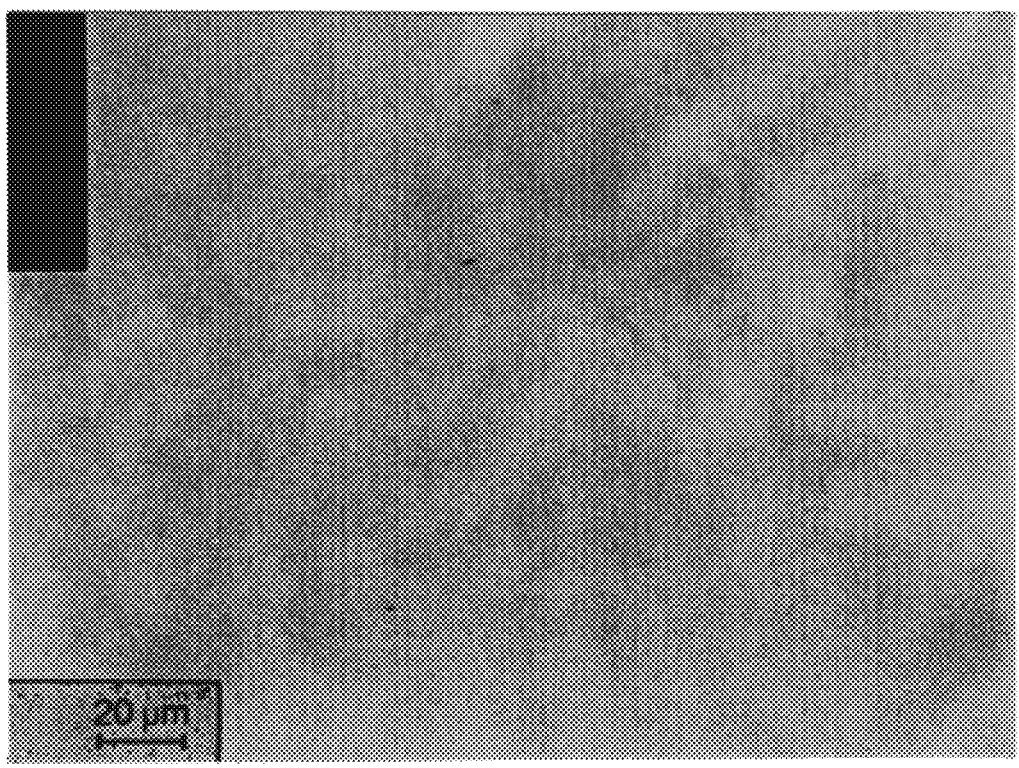

The substrate surface, which again has a region covered by the Ti/Au pad, as shown in FIG. 14A. As expected, the surface features are considerably smaller on this surface than the growth surface. A higher magnification photograph of the uncoated substrate surface, is shown in FIG. 14B.

The sample was heated to 800° C. in atmospheric pressure air inside the furnace for a period of 1 minute. No visible degradation occurred to either surface so it was returned to the furnace for an additional minute. Once again, the surfaces were not etched and no change in the IR transmission was observed. This result implies that the quality of the CVD diamond effects the etch rate.

Figure 15:
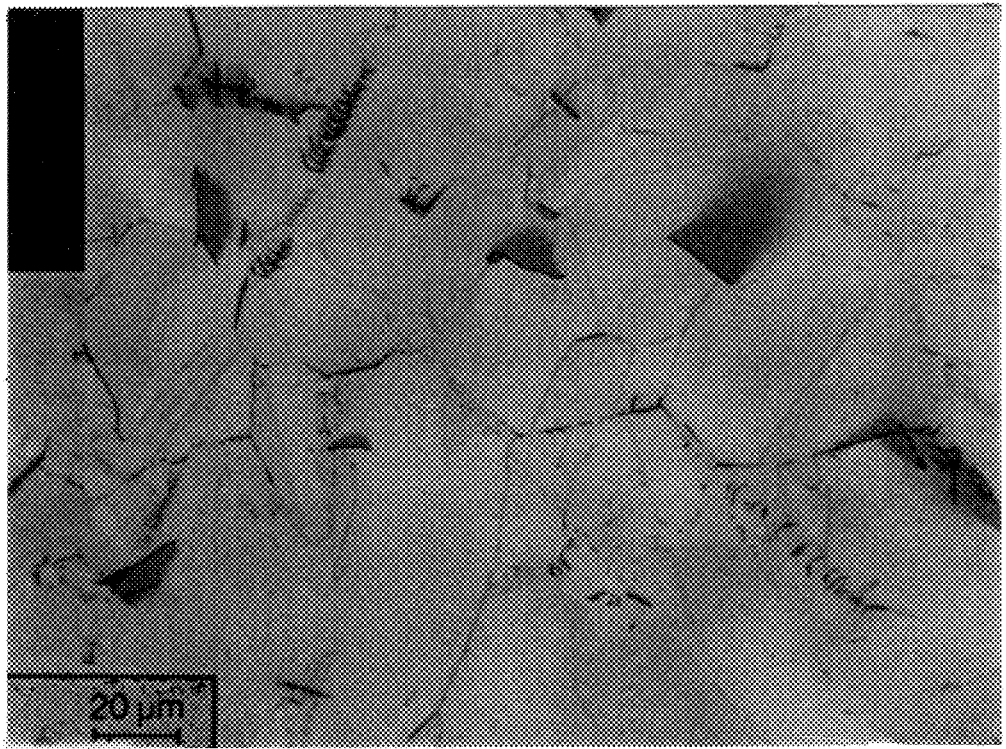
Figure 16:

The sample was then heated to 900° C. for a further minute and this time etching was noticed on the untreated areas of the growth surface as shown in FIG. 15. FIG. 16 shows the treated area of the growth surface and should be compared with FIG. 15.

The treated area has not been attacked in the same manner as the untreated area, in particular, the grain boundaries have not been etched. The surface of the treated area appears to be etched uniformly and a slight "mottling" effect can be seen. In contrast, the untreated region of the growth surface shows all the characteristic features seen in FIG. 7.

Effect on the IR Transmission Properties

Figure 17:
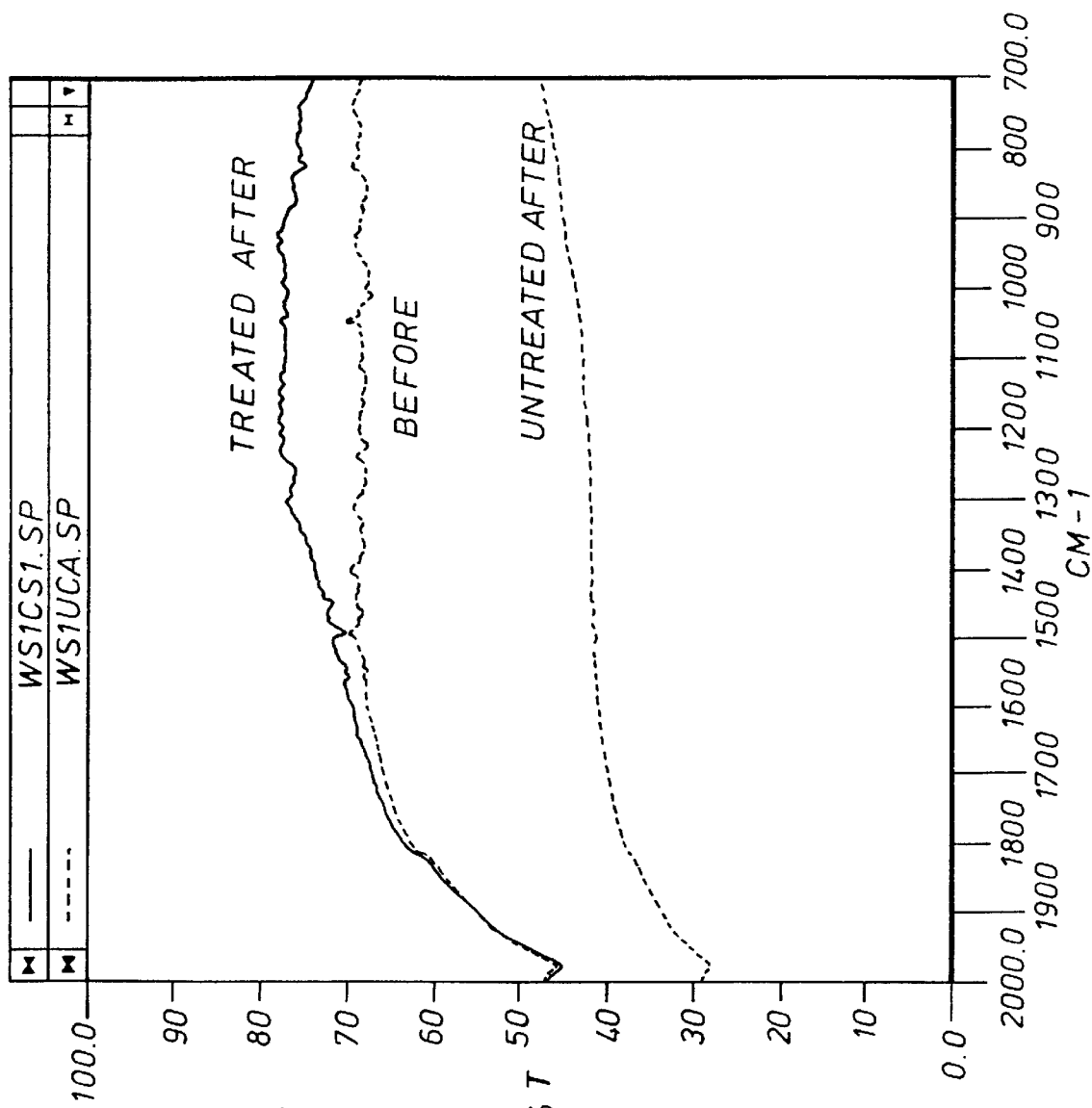

FIG. 17 shows the IR transmission through the treated sample prior to hot air etching ("before" line). The interference fringes seen at high wavenumbers are probably caused by a thin coating on the diamond surfaces. The IR transmission, after the 900° C. etch, is shown as FIG. 17. The treated area appears to have increased in transmission whilst the untreated areas have fallen as expected.

Further heating in air for 1 minute at 1000° C. resulted in the sample being etched in the normal manner over all the regions of both surface, looking identical to FIGS. 9 and 10.

Surface Analysis of Modified CVD Diamond Samples

Secondary Ion Mass spectroscopy (SIMS) was undertaken to characterise the treated and untreated diamond surfaces. In this example the surface was modified with Ti. The untreated region was found to be Ti-free whilst the treated region showed Ti that had reacted with the diamond (forming a TiC) and had remained after the digestion of the Ti layer. SIMS analysis also showed that the modified surface contains both oxygen and nitrogen whilst these were absent from the untreated area. These are small levels of impurity resulting from the Ti deposition and the result of reaction between the thin TiC layer and the air.

Conclusion

The experiments have shown that the crystallographic defects (including grain boundaries) present in CVD diamond are etched by high temperature air. The etch rate depends upon the temperature and the reaction time, although noticeable effects have been observed at 700° C. for an etch period of only one minute. The substrate surface, which is more defective and more highly stressed than the growth surface, is attacked at a lower temperature than the growth surface.

After a reaction period of only 1 minute at 800° C., the hot air etched polished surfaces scatter IR light to such an extent to render the window virtually useless for high speed missile applications.

Windows that have been surface modified (by bias sputtering of titanium and acid removal of the thin titanium coating on to the diamond surfaces) offer protection to the grain boundaries (and other crystallographic defects) against hot air erosion. Treated samples do not show any reduction in the IR transmission properties even after a 1 minute hot air etch at 900° C. It is believed that the Ti forms a passive carbide layer at the grain boundary surfaces and this significantly lowers the reaction with hot air.

What we claim is:

1. A method of treating a diamond surface containing stressed surface defects, wherein said stressed surface defects are grain boundaries, twin defects or polishing damages comprising the steps of depositing a layer of carbide-forming metal on the diamond surface by vacuum sputtering, vacuum deposition or chemical vapour deposition, so as to form carbide at the stressed surface defects, and thereafter removing the deposited carbide-forming metal layer while permitting said carbide to remain at said stressed surface defects, thereby passivating the stressed surface defects.

2. A method according to claim 1 wherein the carbide-forming metal is selected from the group consisting of titanium, molybdenum, tungsten, tantalum, niobium, hafnium, scandium, vanadium, chromium, zirconium, lanthanum, rhenium and silicon.

3. A method according to claim 1 wherein the deposited carbide-forming metal layer is removed by acid dissolution.

4. A method according to claim 3 wherein the acid is a strong inorganic acid.

5. A method according to claim 4 wherein the acid is a mixture of hydrofluoric and nitric acids.

6. A method according to claim 1 wherein the deposited carbide-forming metal layer is removed mechanically.

7. A method according to claim 1 wherein the diamond is CVD diamond.

8. A method according to claim 1 wherein the diamond surface is a polished surface.

9. A method according to claim 1 wherein the treated diamond surface is a surface of a diamond window.

* * * * *